(12) United States Patent
Lin et al.

(10) Patent No.: US 10,541,365 B1
(45) Date of Patent: Jan. 21, 2020

(54) PHASE CHANGE MEMORY AND METHOD OF FABRICATING SAME

(71) Applicant: Taiwan Semiconductor Manufacturing Co., Ltd., Hsinchu (TW)

(72) Inventors: Yu Chao Lin, Hsinchu (TW); Jau-Yi Wu, Hsinchu (TW); Yu-Sheng Chen, Hsinchu (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/998,689

(22) Filed: Aug. 15, 2018

(51) Int. Cl.
*H01L 45/00* (2006.01)
*H01L 27/24* (2006.01)

(52) U.S. Cl.
CPC ...... *H01L 45/1675* (2013.01); *H01L 27/2436* (2013.01); *H01L 27/2463* (2013.01); *H01L 45/065* (2013.01); *H01L 45/1233* (2013.01); *H01L 45/1253* (2013.01); *H01L 45/144* (2013.01)

(58) Field of Classification Search
CPC .............. H01L 45/1675; H01L 45/065; H01L 45/1253; H01L 45/1233; H01L 27/2436; H01L 27/2463; H01L 45/144
See application file for complete search history.

(56) References Cited

U.S. PATENT DOCUMENTS

| | | | |
|---|---|---|---|
| 9,577,010 B2 | 2/2017 | Sciarrillo | |
| 9,590,012 B2 | 3/2017 | Lee et al. | |
| 2006/0261321 A1* | 11/2006 | Happ | G11C 13/0004 257/1 |
| 2007/0029676 A1* | 2/2007 | Takaura | G11C 13/0004 257/758 |
| 2009/0079005 A1* | 3/2009 | Haffner | H01L 21/28123 257/368 |
| 2009/0220744 A1* | 9/2009 | Martinez, Jr. | G11C 13/0004 428/156 |
| 2010/0123122 A1* | 5/2010 | Srinivasan | H01L 27/1021 257/30 |

* cited by examiner

*Primary Examiner* — Syed I Gheyas
(74) *Attorney, Agent, or Firm* — Seed IP Law Group LLP

(57) ABSTRACT

The current disclosure describes techniques for patterning a phase-change memory layer. A SiON layer is used as a first hard mask and an electrical conductive protective layer is used as a second hard mask to pattern the phase-change memory layer. An organic BARC layer is sued to improve the photolithography accuracy. The thickness ratio between the organic BARC layer and the hard mask SiON layer and the etching conditions of the hard mask SiON layer are controlled such that the patterned organic BARC layer is completely or near completely resolved simultaneously with the patterning of the hard mask SiON layer.

20 Claims, 9 Drawing Sheets

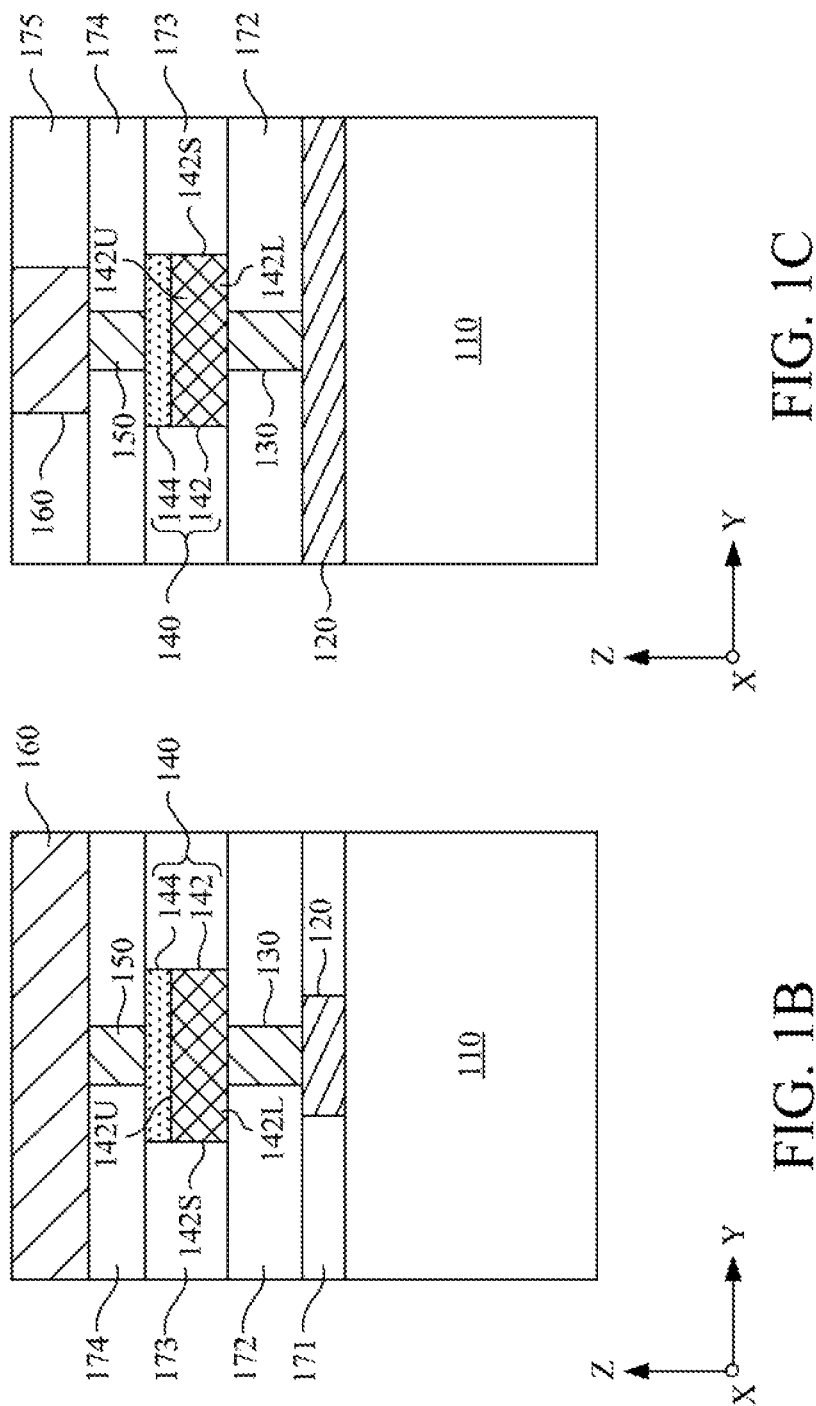

PHASE CHANGE MEMORY AND METHOD OF FABRICATING SAME

BACKGROUND

A memory cell of a phase-change memory generally includes a phase-change material that changes its physical states, e.g., between amorphous and crystalline, due to thermal effects. With the phase change, the impedance or other electrical properties of the phase-change material also changes, which may be used to indicate the "1" or "0" logical states. A phase-change material includes a chalcogenide alloy such as germanium antimony tellurium ("GST"). GST includes GeTe and $SbTe_2$ and is normally in the composition of $Ge_2Sb_2Te_5$.

GST overall is very susceptible to oxidization. Among the three elements, germanium "Ge" is more easily to oxidize than tellurium "Te", and antimony "Sb" is the least oxidizable. As such, oxidization not only damages a GST material overall, but also makes its chemical composition of $Ge_2Sb_2Te_5$ relocate due to the different oxidization rates among Ge, Te and Sb.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

FIGS. 1A-1C are perspective views and cross-sectional views of an example PCM memory device according to example embodiments of the disclosure;

DETAILED DESCRIPTION

Figure 1A:
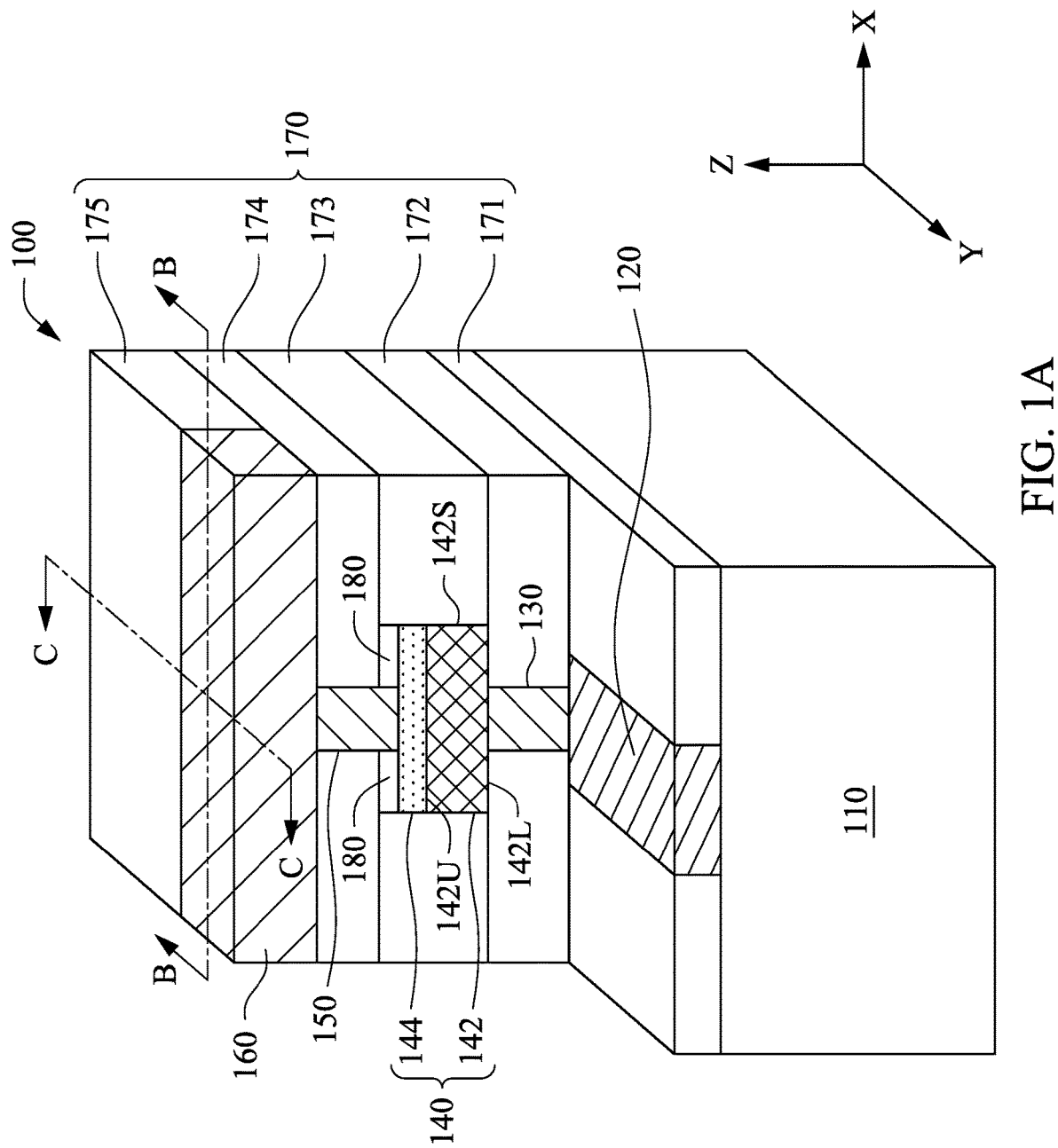

The current disclosure is directed to a phase-change memory device and a method of making the phase-change memory device. The phase-change memory cell is formed from a layer of phase-change material, e.g., germanium-antimony-tellurium "GST", and a conductive protective layer, e.g., titanium nitride "TiN". The TiN layer servers, among others, as a hard mask layer in the patterning of the PCM layer. Another hard mask layer of dielectric material, e.g., silicon oxygen nitride "SiON" is formed over the TiN layer. An organic bottom anti-reflective coating "BARC" layer is used to improve the photolithography accuracy. The organic BARC layer is patterned as a mask to pattern the hard mask dielectric layer of SiON. The thickness ratio between the organic BARC layer and the hard mask SiON layer and the etching conditions of the hard mask SiON layer are controlled such that the patterned organic BARC layer is completely or near completely resolved simultaneously with the patterning of the hard mask SiON layer. As a result, no separate stripping of the BARC layer is needed and the undesirable byproducts, e.g., oxygen $O_2$, are reduced. The patterned SiON layer is used as a mask to pattern the TiN layer, i.e., another hard mask layer over the PCM layer. The etchants for the TiN layer are selected to have capacity to resolve the residual organic BARC layer such that any byproducts of removing the organic BARC layer are still shielded away from the PCM layer. That is, the organic BARC layer is completely removed before the PCM layer is exposed in the patterning of the TiN layer. The patterned TiN layer is used as a mask to pattern the PCM layer. The byproducts of the resolution of the TiN layer only affect a portion of the PCM layer, if any, that is to be removed later. The remaining TiN layer protects the underneath PCM layer from damaging chemicals. This procedure of patterning the PCM layer ensures that the resultant PCM cell is substantially free of damages caused by oxidization.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1A is a perspective view of a device 100. FIG. 1B is a cross-sectional view of the device 100 viewing from cutting-line B-B, and FIG. 1C is a cross-sectional view of the device 100 viewing from cutting-line C-C. Referring to FIGS. 1A to 1C together, the device 100 includes a substrate 110 that includes one or more transistor devices (not shown for simplicity) thereon. A first metal line 120 is formed over the substrate 110. The first metal line 120 contacts the transistor devices on the substrate 110. A first electrode 130 (bottom electrode") is formed over the first metal line 120 and contacts the first metal line 120. A phase-change memory cell 140 is formed over the first electrode 130 and contacts the first electrode 130. A second electrode 150 ("top electrode") is formed over the phase-change memory cell 140 and contacts the phase-change memory cell 140. A second metal line 160 is formed over the second electrode 150 and contacts the second electrode 150. In an embodiment, as shown in FIG. 1A, the second metal line 160 is oriented in a direction substantially orthogonal to the first metal line 120. For example, the first metal line 120 is oriented in the y-axis direction and the second metal line 160 is oriented in the x-axis direction.

Insulation layer(s) 170 is formed over the substrate 110 and adjacent to the first metal line 120, the first electrode 130, the phase-change memory cell 140, the second electrode 150 and/or the second metal line 160. The insulation layer 170 may include multiple layers 171, 172, 173, 174, 175 that are formed in different procedures and include same or different dielectric materials.

The first metal line 120 and the second metal line 160 each is copper "Cu", tungsten "W", aluminum "Al", cobalt "Co" or other suitable metal or electrically conductive materials. The first electrode 130 and the second electrode 150 each is a connect or interconnect structure having Cu, Al, titanium nitride "TiN", tantalum nitride "TaN" or other suitable electrically conductive materials.

In an embodiment, the phase-change cell 140 includes a layer 142 of a phase-change material "PCM layer" and a protective layer 144. The protective layer 144 is TaN, graphite, W, TiN or other suitable electrically conductive materials. In an embodiment, the protective layer 144 includes a thickness ranging from about 15 nm to about 30 nm. The PCM layer 142 includes $Ge_2Sb_2Te_5$, GeTe or other phase-change materials. In an embodiment, the PCM layer 142 includes a thickness ranging from about 20 nm to about 45 nm.

The PCM layer 142 includes side portions 142S, an upper surface portion 142U and a lower surface portion 142L. In the fabrication processes of forming the phase-change memory cell 140, the upper surface portion 142U is covered by the protective layer 144 and the lower surface portion 142L is covered by the dielectric layer 172 and the bottom electrode 130. As such, the upper surface portion 142U and the lower surface portion 142L is not exposed to oxygen and is not oxidized. Under the disclosure fabrication processes, the side portions 142S are also not exposed to oxygen and are not oxidized. Therefore, the side portions 142S include a substantially same atom percentage or ratio of oxygen as the upper surface portion 142U and/or the lower surface portion 142L. The atom ratio or percentage of the oxygen is determined based on a ratio between the oxygen atom and an atoms of an element in the GST material. For example, an atom ratio of oxygen is determined between oxygen atoms and germanium atoms. Further details on this feature are described herein.

In an embodiment, optionally, a dielectric layer 180 is formed above the protective layer 144 and adjacent to the top electrode 160. The dielectric layer 180 is silicon oxygen carbide "SiOC", silicon oxygen nitride "SiON", silicon nitride "SiN" or a silicon doped bottom anti-reflective coating layer.

Figure 2:
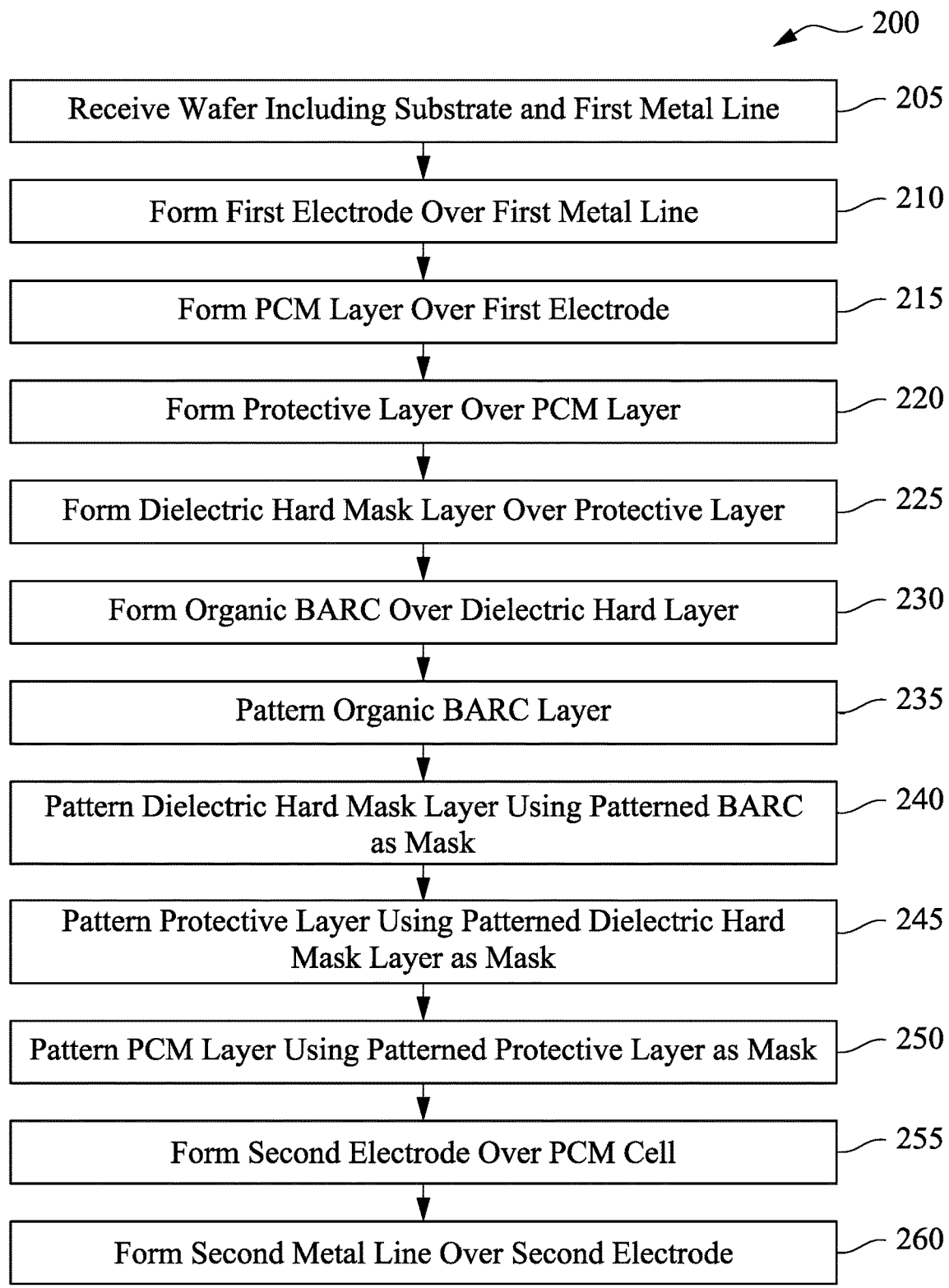
FIG. 2 is a flow chart of an example fabrication process according to example embodiments of the disclosure.

FIG. 2 is a flow chart diagram of an example process 200 that can be used to fabricate the device 100 and/or other devices.

FIGS. 3-14 show stages of a wafer 300 in a process of making the example device 100. At each stage, a cross-sectional view of the wafer 300 are shown in the cutting line B-B of FIG. 1A for simplicity.

Figure 3:
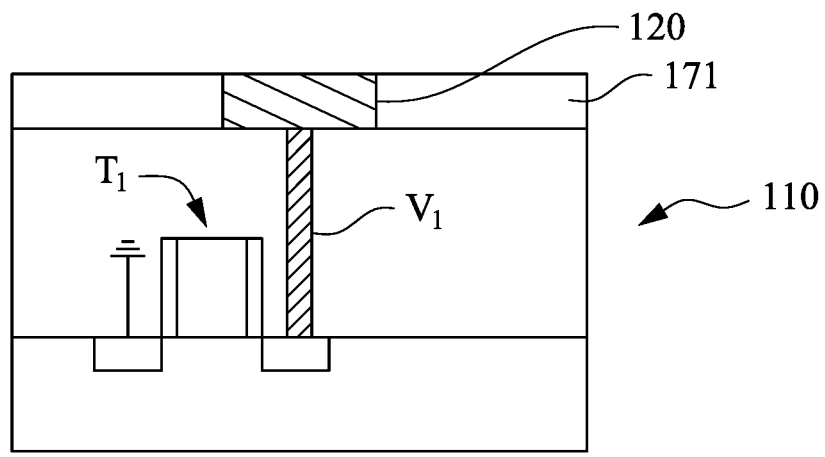
FIGS. 3-14 are cross-sectional views of various stages of making the example device of FIGS. 1A-1C according to example embodiments of the disclosure.

Referring to FIG. 2, with reference also to FIG. 3, in example operation 205, a wafer 300 is received. The wafer 300 includes a substrate 110 and a first metal line 120 formed over the substrate 110. The first metal line 120 is connected to a source/drain terminal of a transistor T1 of the substrate 110 through an interconnect structure V1. Another source/drain terminal of the transistor T1 is coupled to a low (or high) voltage terminal, e.g., a ground terminal. When the transistor T1 is turned on, a current may pass through from the metal line 120 to the ground terminal, which is further described herein.

The first metal line 120 may be formed using physical vapor deposition, chemical vapor deposition, electroplating or other suitable routines. Further, the first metal line 120 may be formed through the lift-out routine or the damascene routine.

The first metal line 120 is copper "Cu", tungsten "W", aluminum "Al", silver "Ag", cobalt "Co" or other suitable metal materials.

The dielectric layer 171, e.g., an inter-layer dielectric ILD, may be formed adjacent to the first metal line 120. The dielectric layer 171 is silicon oxide, a low K dielectric material or other suitable dielectric material. The low K dielectric material for the layer 171 includes silicon oxynitride, silicon nitride (Si3N4), silicon monoxide (SiO), silicon oxynitrocarbide (SiONC), silicon oxycarbide (SiOC), vacuum, and other dielectrics or other suitable materials. The dielectric layer 171 may be formed through chemical vapor deposition (CVD), high density plasma CVD, spin-on, sputtering, or other suitable approaches.

Figure 4:
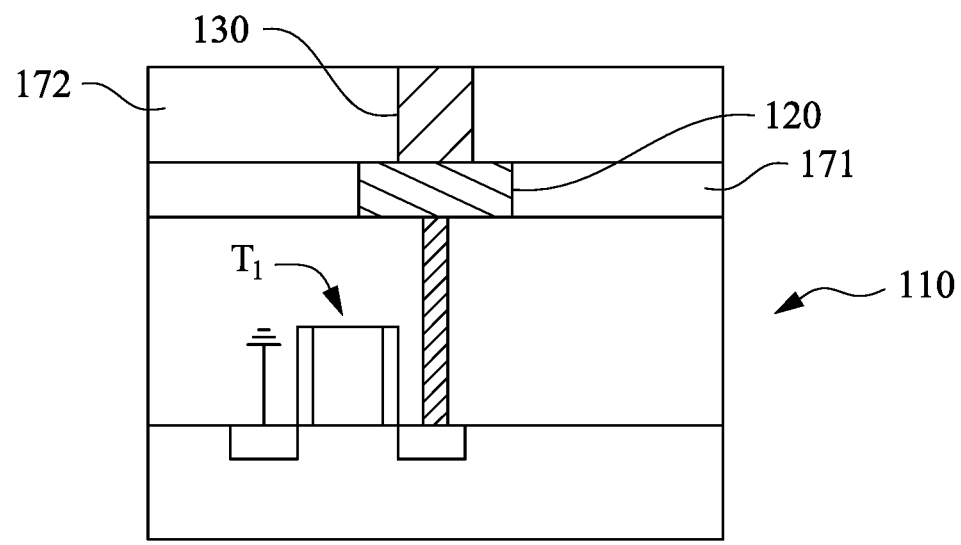

Referring back to FIG. 2, with reference also to FIG. 4, in example operation 210, a first electrode "bottom electrode" 130 is formed over the first metal line 120. The first electrode 130 may be formed as an interconnect structure, e.g., a via or a contact plug, through a lift-out routine or a damascene routine. The first electrode 130 is Cu, W, Al, Co or other suitable metal or electrically conductive materials. Dielectric layer 172 is formed adjacent to the first electrode 130 and may include a same or a different dielectric material with respect to the dielectric layer 171. Further, a liner layer (not shown for simplicity) may be formed between the first electrode 130 and the dielectric layer 172.

Figure 5:
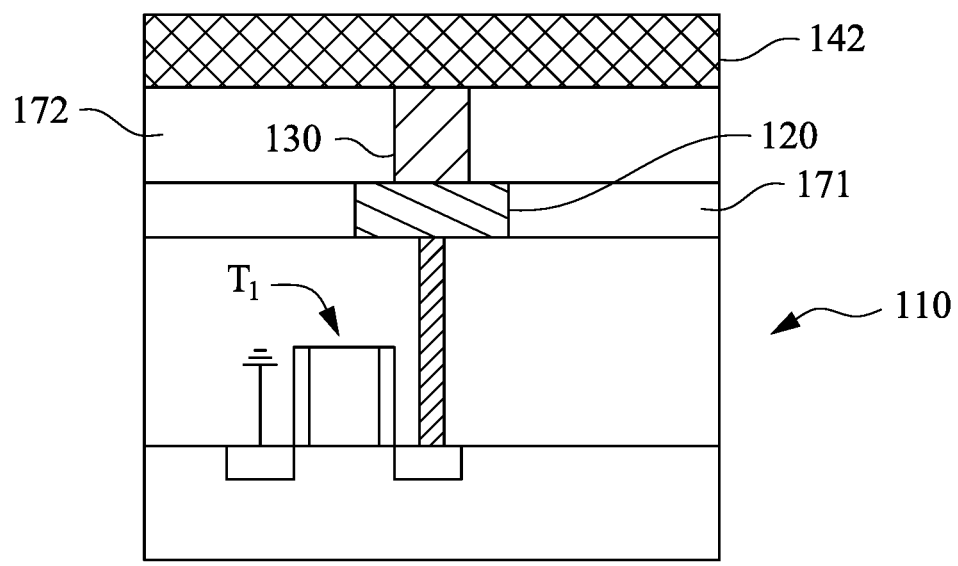

Referring back to FIG. 2, with reference also to FIG. 5, in example operation 215, a PCM layer 142 is formed over the first electrode 130 and the dielectric layer 172. The PCM layer 142 is a chalcogenide alloy, e.g., GST, germanium tellurium or other phase-change materials. The PCM layer 142 is formed using vapor deposition processes, such as chemical vapor deposition (CVD), metalorganic chemical vapor deposition (MOCVD), atomic layer deposition (ALD), or other vapor phase techniques. The PCM layer 142 includes a thickness ranging from about 20 nm to about 40 nm. In an embodiment, the PCM layer 142 includes a thickness of about 30 nm.

Figure 6:
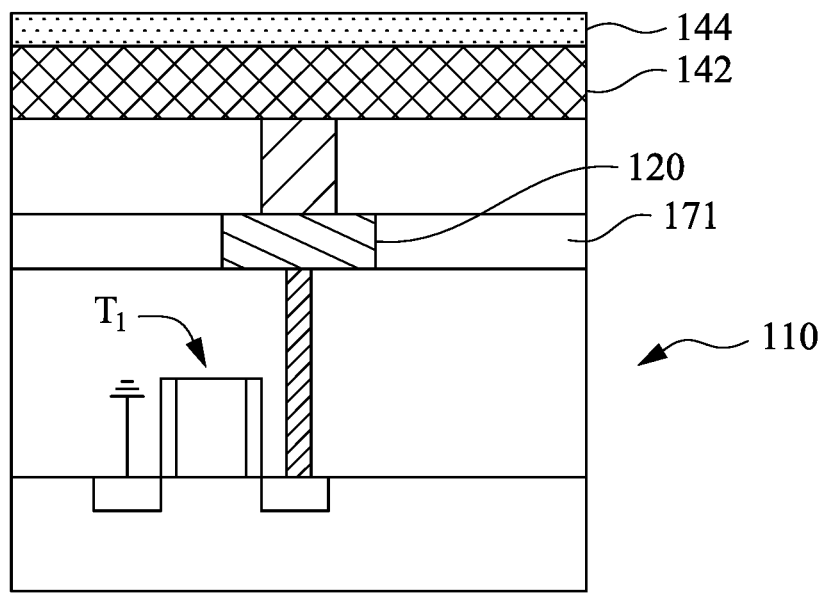

Referring back to FIG. 2, with reference also to FIG. 6, in example operation 220, a protective layer 144 is formed over the PCM layer 142. In an embodiment, the protective layer 144 is formed of an electrical conductive material including one or more of tantalum nitride "TaN", titanium nitride "TiN", tungsten "W", graphene or other suitable conductive material. In an embodiment, the protective layer 144 is formed of a thickness ranging from about 15 nm to about 35 nm. In an embodiment, the protective layer 144 includes a thickness of about 20 nm.

Figure 7:
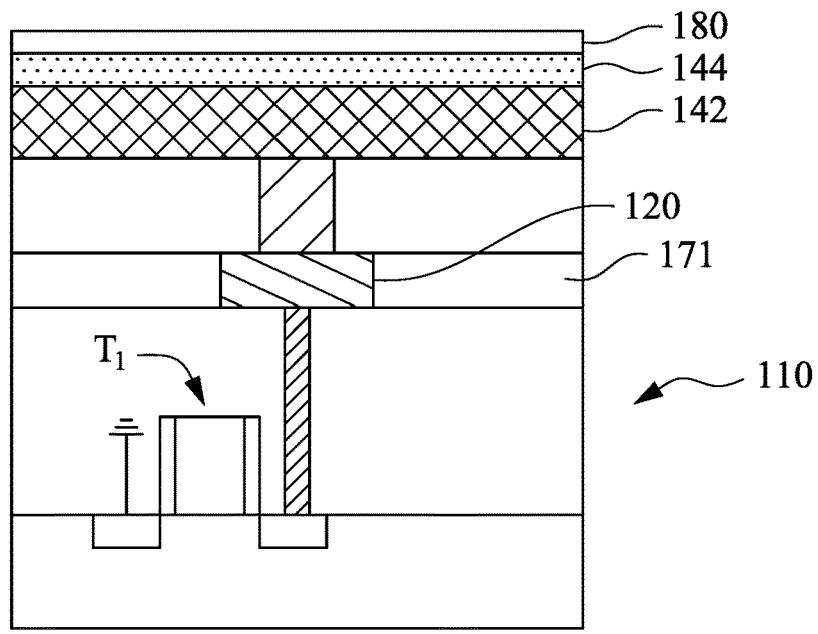

Referring back to FIG. 2, with reference also to FIG. 7, in example operation 225, a dielectric hard mask layer 180 is formed over the protective layer 144 using suitable processes. In an embodiment, the dielectric hard mask layer 180 is one or more of SiOC, SiON, SiN or a silicon doped bottom anti-reflective coating layer. In an embodiment, the dielectric hard mask layer 180 is formed with a thickness ranging between 25 nm to about 65 nm. In an embodiment, the dielectric layer 180 includes a thickness of about 38 nm.

Figure 8:
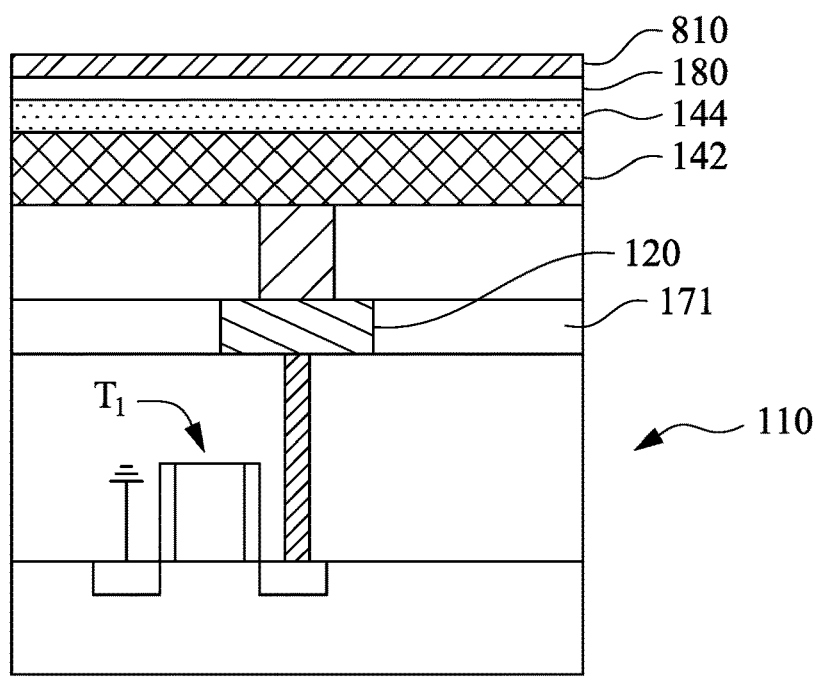

Referring back to FIG. 2, with reference also to FIG. 8, in example operation 230, an organic bottom anti-reflective coating "BARC" layer 810 is formed over the dielectric hard mask layer 180. The organic BARC layer 810 contains carbon "C", hydrogen "H" and oxygen "O" atoms. In an embodiment, the organic BARC layer 810 is spin coated with a thickness ranging from about 15 nm to about 45 nm. In an embodiment, the organic BARC layer includes a thickness of about 25 nm. The organic BARC layer 810 is also referred to as an organic planarization layer in a generic sense.

In an embodiment, a thickness ratio between the organic BARC layer 810 and the dielectric hard mask layer 180 is ranging between about 1:1.2 to about 1:2.0. The thickness ratio is critical in that with this ratio, when the organic BARC layer 810 is used as a mask to pattern the dielectric hard mask layer 180, the organic BARC layer 810 will be fully resolved or etched out or remain as a minimum residual simultaneously with the etching of the dielectric hard mask layer 180.

Then a photoresist layer 820 is formed and patterned over the organic BARC layer 810.

Figure 9:
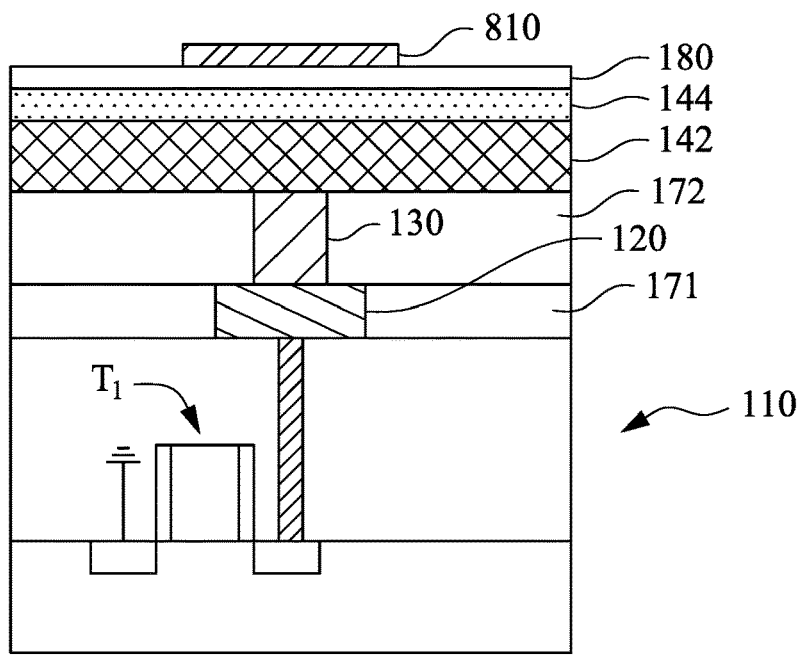

Referring back to FIG. 2, with reference also to FIG. 9, in example operation 234, the organic BARC layer 810 is patterned using the patterned photoresist layer 820 as a mask. The patterning may be conducted through a plasma enhanced dry etching, e.g., adaptively coupled plasma (ACP), where a mixture of etch gases are applied with various controlled flow rates and under some constant pressure(s).

In an embodiment, the organic BARC layer 810 is dry etched using an etch gas flow including oxygen "$O_2$", chlorine gas "$Cl_2$", helium "He", and difluoromethane "$CH_2F_2$". Note that the etchants cannot reach the PCM layer 142 due to the existence of the dielectric hard mask layer 180 and the protective layer 144. In an example, the dry etching is conducted in a dry etching chamber, e.g., a transformer coupled plasma (TCP) or inductively coupled plasma (ICP) chamber, with an ESC (electronic chuck) temperature ranging from about 30° C. to about 120° C., a chamber wall temperature ranging from about 30° C. to about 120° C. and a transformer coupled plasma (TCP) window temperature ranging from about 100° C. to about 150° C. The etching recipe for the organic BARC layer 180 includes a pressure ranging from about 1 mT to about 100 mT, a TCP source power ranging from about 200 Watt to about 800 Watt, a bias voltage ranging from about 100V to about 500V and etch gas $O_2$ of about 1 sccm to about 20 sccm, $Cl_2$ of about 5 sccm to about 50 sccm, He of about 5 sccm to about 50 sccm, and $CH_2F_2$ of about 5 sccm to about 50 sccm.

Figure 10:
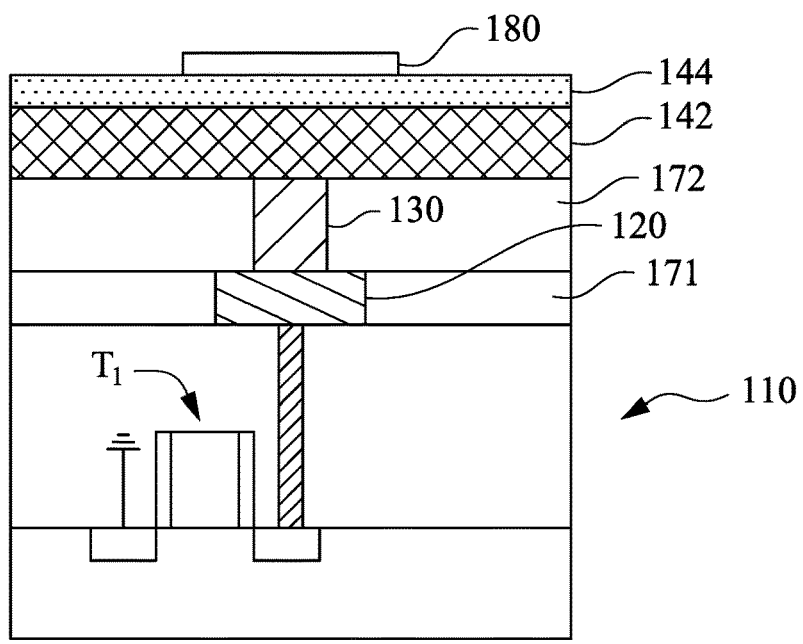

Referring back to FIG. 2, with reference also to FIG. 10, in example operation 240, the dielectric hard mask layer 180 is patterned using the patterned organic BARC layer 810 as a mask. In an embodiment, the etchants used in the etching of the dielectric hard mask layer 180 includes a relative low selectivity to the organic BARC layer 810 such that the patterned organic BARC layer 810 is at least partially etched out too. In some embodiment, the organic BARC layer 810 is completely or near completely etched out simultaneously with the patterning of the dielectric hard mask layer 180. In an embodiment, in the case that the dielectric hard mask layer 180 is SiON, it is dry etched using a gas flow containing helium "He" and difluoromethane "$CH_2F_2$", sulfur hexafluoride "$SF_6$", and carbon tetrafluoride "$CF_4$". For example, the etching recipe for the SiON layer 180 includes a pressure ranging from about 1 mT to about 100 mT, a TCP source power ranging from about 200 Watt to about 1000 Watt, a bias voltage ranging from about 100V to about 700V, and etch gas $SF_6$ of about 10 sccm to about 80 sccm, $CF_4$ of about 10 sccm to about 50 sccm, He of about 100 sccm to about 300 sccm, and $CH_2F_2$ of about 10 sccm to about 100 sccm.

In an embodiment, the residual organic BARC layer 810 is stripped using, e.g., $O_2$, $N_2$ or $SF_6$. Note that due to the existence of the protective layer 144, the PCM layer 142 is shielded from the chemistry of the BARC layer 810 stripping.

In another embodiment, no stripping routine is performed on the residual organic BARC layer 810.

Figure 11:
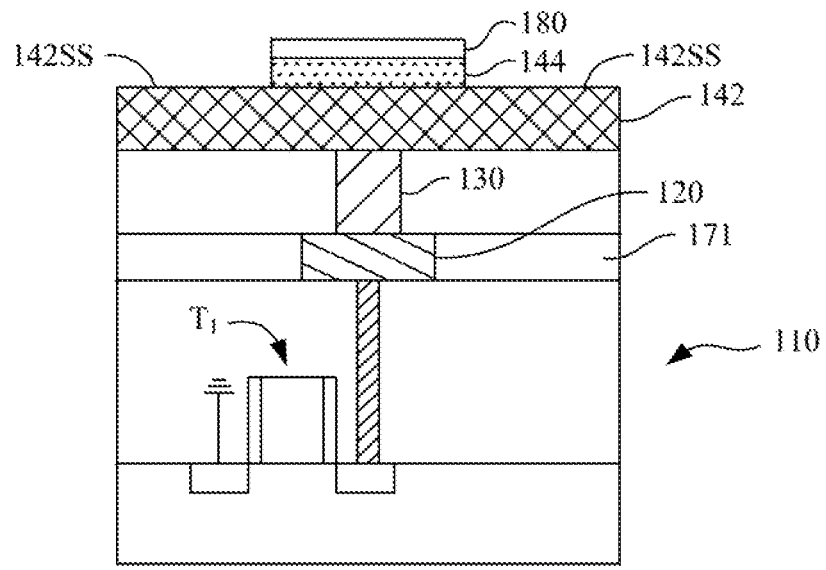

Referring back to FIG. 2, with reference also to FIG. 11, in example operation 245, the protective layer 144 is patterned using the patterned dielectric layer 180 and the residual organic BARC layer 810, if any, as a mask. In an embodiment, the etchants for the protective layer 144 is selected to be able to also remove the residual organic BARC layer 810. For example, the dry etch gas flow for the protective layer 144 includes $Cl_2$ to, among others, etch out the residual organic BARC layer 810. Because the residual organic BARC layer 810, if any, is very thin due to the controlled thickness ratio between the organic BARC layer 810 and the dielectric layer 180, the residual organic BARC layer 810 and the related etching byproducts, e.g., $O_2$, $N_2$, or polymer residuals, are all removed before the protective layer 144 is fully patterned to expose the PCM layer 142.

The byproducts of etching the protective layer 142, e.g., nitrogen, may only affect exposed regions 142SS of the PCM layer 142 in a very short period of time. As the exposed regions 142SS are removed in the patterning of the PCM layer 142 using the patterned protective layer 144 as a mask, the damage to the resultant PCM cell underneath the protective layer 144 is minimized.

In an embodiment, in the case that the protective layer 144 is TiN, the dry etch gas flow includes $Cl_2$, $CH_4$, Argon "Ar", and hydrogen bromide "HBr". For example, the etching recipe for the TiN layer 144 includes a pressure ranging from about 1 mT to about 100 mT, a TCP source power ranging from about 200 Watt to about 1000 Watt, a bias voltage ranging from about 100V to about 900V, and etch gas $Cl_2$ of about 10 sccm to about 200 sccm, $CF_4$ of about 10 sccm to about 100 sccm, Ar of about 50 sccm to about 500 sccm, and HBr of about 10 sccm to about 100 sccm.

Figure 12:
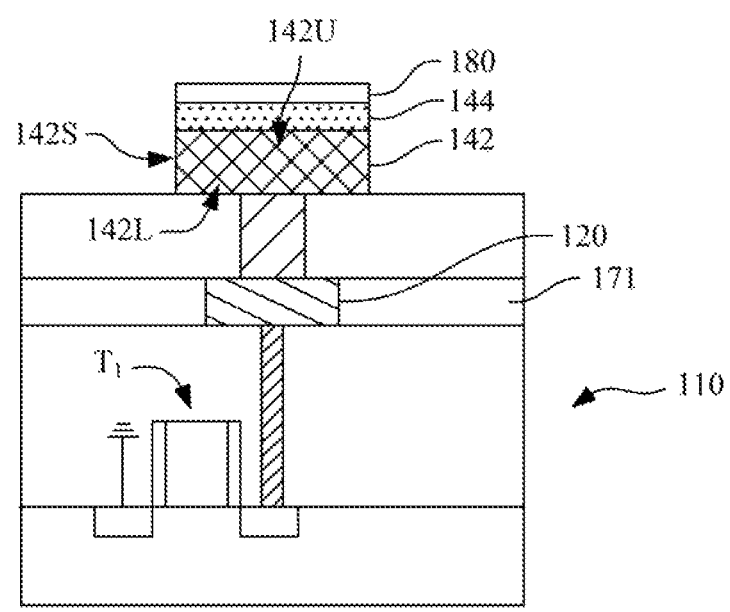

Referring back to FIG. 2, with reference also to FIG. 12, in example operation 250, the PCM layer 142 is patterned using the patterned protective layer 144 and the patterned dielectric hard mask layer 180 as a mask. In an embodiment, the PCM layer 142 is dry etched using a gas flow containing $Cl_2$, Ar, HBr and $CH_2F_2$. For example, the etching recipe for the PCM layer 142 includes a pressure ranging from about 1 mT to about 100 mT, a TCP source power ranging from about 200 Watt to about 500 Watt, a bias voltage ranging from about 100V to about 500V, and etch gas $Cl_2$ of about 10 sccm to about 100 sccm, Ar of about 50 sccm to about 500 sccm, $CH_2F_2$ of about 10 sccm to about 50 sccm, and HBr of about 10 sccm to about 100 sccm.

Because no oxygen $O_2$, or other oxidizers are generated in the process, the sidewall portion 142S of the PCM layer 142 is not oxidized more than the upper surface portion 142U or the lower surface portion 142L of the PCM layer 142. As such, the atom percent of oxygen are substantially the same among the sidewall portion 142S, the upper surface portion 142U and the lower surface portion 142L of the PCM layer 142.

As the dielectric hard mask layer 180 is used as the mask in the patterning of the protective layer 144 and the PCM layer 142, the dielectric layer 180 is at least partially etched out. In an embodiment, the etching conditions of the patterning of the protective layer 144 and the PCM Layer 142 are controlled such that a portion of the dielectric hard mask layer 180 remains after the PCM layer 142 is patterned. The remaining dielectric layer 180 is used as an etch stop layer for a subsequent fabrication process.

The patterned PCM layer 142 and the patterned protective layer 144 form together as the PCM memory cell 140.

Figure 13:
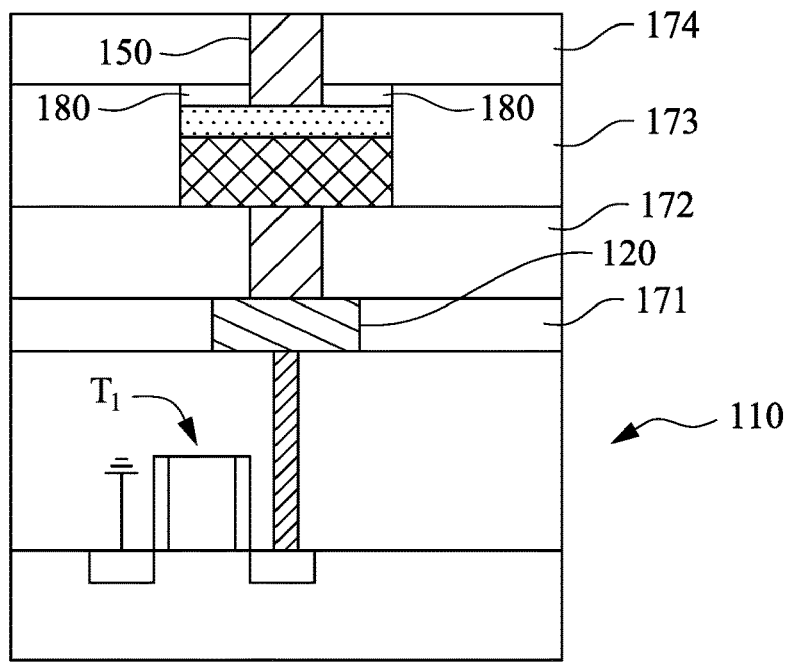

Referring back to FIG. 2, with reference also to FIG. 13, in example operation 255, the second electrode 150 is formed over the PCM cell 140. Multiple routines are conducted in the forming of the second electrode 150. For example, the dielectric layer 173 is formed adjacent to the PCM cell 140. A CMP routine may be conducted to make the dielectric layer 173 coplanar with the protective layer 144 or the residual dielectric hard mask layer 180, if any. Another dielectric layer 174 is formed over the dielectric layer 173 and the second electrode 150 is formed through the dielectric layer 174 as a contact or interconnect structure, using the lift-out routine or the damascene routine. In another example, the dielectric layer 173 and the dielectric layer 174 are formed as one layer and a CMP routine is performed only after the second electrode 150 is deposited through the dielectric layer 173/174. As discussed herein, the residual dielectric hard mask layer 180 may function as an etch stop layer in the formation of the second electrode 150.

The second electrode 150 is one or more of is Cu, W, Al, Co or other suitable electrical conductive materials.

Figure 14:
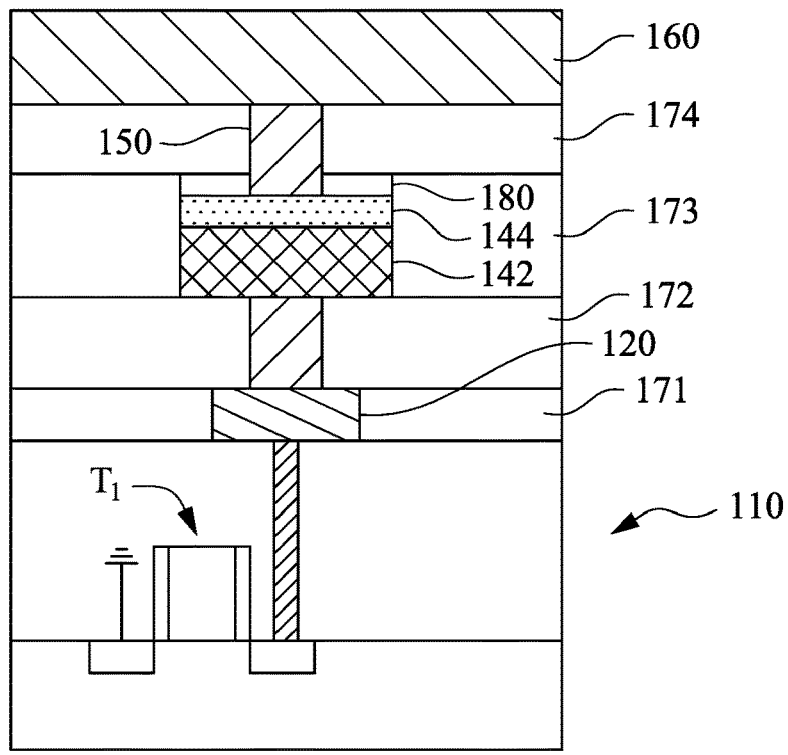

Referring back to FIG. 2, with reference also to FIG. 14, in example operation 260, the second metal line 160 is formed over the second electrode 150. In an embodiment, the second metal line 160 is substantially orthogonal to the first metal line 120, and is copper "Cu", tungsten "W", aluminum "Al", silver "Ag", cobalt "Co" or other suitable electrical conductive materials. In an embodiment, the second metal line 160 includes a same electrical conductive material as the first metal line 120.

In operation, the second metal line 160 may be configured as a bit line for the PCM memory cell 140. When the transistor T1 is switched on and a bit line voltage is applied to the bit line (second metal line) 160, a current passes through the PCM memory cell 140 to the ground terminal. Based on the phase of the PCM memory cell 140, the resistance of the whole current path will vary and the current value will vary. The current value is detected to read a logic state, i.e., the phase, as stored in the PCM memory cell 140.

As appreciated, oxidation of the PCM material in the PCM cell 140 will change the composition of the GST or GT material, e.g., the ratios between germanium, tellurium, and antimony within the GST composition. Such GST relocation will affect the resistance differentiation between different phases, e.g., amorphous phase v. crystalline phase, and cause data reading and writing failures or inaccuracies. The disclosed fabrication techniques and resultant PCM memory structures ensure that no oxide or little oxide is formed in the GST material of the PCM cell. As such, the quality of the PCM memory products and the related manufacture efficiency are improved.

Although the techniques are described using specific example embodiments, alternative embodiments are also possible and included. For example, other materials may be used to substitute for the organic BARC layer 810. A dielectric layer of SiON or SiOC may be used to as a BARC layer over the dielectric hard mask layer 180. When a SiON (or SiOC) layer 810 is formed as a BARC above the hard mask SiON (or SiOC) layer 180, the two SiON layers 180, 810 include different thickness and dielectric constants.

The present disclosure may be further appreciated with the description of the following embodiments:

In a method embodiment, a wafer is received. The wafer includes a substrate. A first contact structure is formed over the substrate. A layer of phase-change material is formed over the first contact structure. A dielectric layer is formed over the phase change material. An organic planarization layer is formed over the dielectric layer. The organic planarization layer is patterned to form a patterned organic planarization layer. The dielectric layer is patterned using the patterned organic planarization layer as a mask to form a patterned dielectric layer. The layer of the phase change material is patterned using the patterned dielectric layer as a mask to form a PCM memory cell. A second contact structure is formed over the phase change memory cell.

In another method embodiment, A wafer is received. The wafer includes a substrate. A layer of phase-change material is formed over the substrate. A conductive layer is formed over the layer of the phase-change material. A dielectric layer is formed directly over the conductive layer. An anti-reflection coating layer is formed directly over the dielectric layer. The anti-reflection coating layer is patterned to form a patterned anti-reflection coating layer. The dielectric layer is patterned using the patterned anti-reflection coating layer as a mask to form a patterned dielectric layer. The conductive layer is patterned using the patterned dielectric layer as a mask to form a patterned conductive layer. A phase change memory cell is formed by patterning the layer of the phase change material using the patterned conductive layer as a mask. A second metal layer is formed over the patterned conductive layer.

In another method embodiment, a dielectric layer is formed over a chalcogenide alloy. An organic anti-reflective coating layer is formed over the dielectric layer. A patterned photoresist layer is formed directly over the organic anti-reflective coating layer. A patterned anti-reflective coating layer is formed by removing a portion of the organic anti-reflective coating layer exposed from the patterned photoresist layer. A patterned dielectric layer is formed by removing a portion of the dielectric layer exposed from the patterned anti-reflective coating layer through an etch procedure. The etch procedure also removes the patterned anti-reflective coating layer. The chalcogenide alloy is patterned using a remaining portion of the dielectric layer as a mask.

What is claimed is:

1. A method, comprising: receiving a wafer, the wafer including a substrate; forming a first contact structure over the substrate;
   forming a layer of phase-change material over the first contact structure; forming a dielectric layer over the phase change material;
   forming an organic planarization layer over the dielectric layer; patterning the organic planarization layer to form a patterned organic planarization layer;
   patterning the dielectric layer using the patterned organic planarization layer as a mask, the patterning the dielectric layer forming a patterned dielectric layer, and the process of patterning the dielectric layer also completely etching out the patterned organic planarization layer;
   forming a phase change memory cell by patterning the layer of the phase change material using the patterned dielectric layer as a mask; and
   forming a second contact structure over the phase change memory cell.

2. The method of claim 1, wherein the wafer includes a first metal line and the first contact structure is formed over the first metal line.

3. The method of claim 2, further comprising forming a second metal line over the second contact structure.

4. The method of claim 3, wherein the first metal line and the second metal line are perpendicular to one another.

5. The method of claim 1, wherein the dielectric layer is one or more of SiOC, SiON, SiN or a silicon doped bottom anti-reflective coating layer.

6. The method of claim 1, wherein the organic planarization layer is an organic bottom anti-reflective coating layer.

7. The method of claim 1, wherein the forming the organic planarization layer includes forming the organic planarization layer having a thickness ratio between the organic planarization layer and the dielectric layer ranging between about 1:1.2 to about 1:2.0.

8. The method of claim 1, further comprising forming and patterning a protective layer between the layer of the phase change material and the dielectric layer.

9. The method of claim 8, wherein the patterning the protective layer uses a gas containing methane and hydrogen bromide.

10. The method of claim 1, wherein the layer of the phase-change material includes germanium-antimony-tellurium.

11. The method of claim 1, wherein the patterning the dielectric layer uses a gas containing sulfur hexafluoride.

12. The method of claim 1, wherein the patterning the layer of the phase-change material uses a gas containing chlorine gas.

13. A method, comprising:
   receiving a wafer, the wafer including a substrate;
   forming a layer of phase-change material over the substrate;
   forming a conductive layer over the layer of the phase-change material;
   forming a dielectric layer directly over the conductive layer;
   forming an anti-reflection coating layer directly over the dielectric layer;
   patterning the anti-reflection coating layer to form a patterned anti-reflection coating layer;
   patterning the dielectric layer using the patterned anti-reflection coating layer as a mask to form a patterned dielectric layer, the process of patterning the dielectric layer also completely etching out the patterned anti-reflection coating layer;
   patterning the conductive layer using the patterned dielectric layer as a mask to form a patterned conductive layer;
   forming a phase change memory cell by patterning the layer of the phase change material using the patterned conductive layer as a mask; and
   forming a second metal layer over the patterned conductive layer.

14. The method of claim 13, wherein when the patterning the layer of the phase change material is completed, the phase-change memory cell includes substantially a same atom ratio of oxygen between a sidewall portion and a surface portion.

15. The method of claim 13, wherein the patterning the conductive layer uses a gas containing methane and hydrogen bromide.

16. A method of patterning a chalcogenide alloy, comprising:
   forming a dielectric layer over the chalcogenide alloy;
   forming an organic anti-reflective coating layer over the dielectric layer;
   forming a patterned photoresist layer directly over the organic anti-reflective coating layer;
   forming a patterned anti-reflective coating layer by removing a portion of the organic anti-reflective coating layer exposed from the patterned photoresist layer;
   forming a patterned dielectric layer by removing a portion of the dielectric layer exposed from the patterned anti-reflective coating layer through etching, the etching also etching out completely the patterned anti-reflective coating layer; and
   patterning the chalcogenide alloy using the patterned dielectric layer as a mask.

17. The method of claim 16, wherein the organic anti-reflective coating layer is thinner than the dielectric layer.

18. The method of claim 16, wherein the chalcogenide alloy includes germanium, antimony, and tellurium.

19. The method of claim 16, further comprising forming a hard mask layer over the chalcogenide alloy and prior to the forming the dielectric layer, and wherein the remaining portion of the dielectric layer is used as a mask to pattern the hard mask layer.

20. The method of claim 19, wherein the hard mask layer is one or more of tantalum nitride, carbon, tungsten or titanium nitride.

* * * * *

UNITED STATES PATENT AND TRADEMARK OFFICE
CERTIFICATE OF CORRECTION

PATENT NO. : 10,541,365 B1
APPLICATION NO. : 15/998689
DATED : January 21, 2020
INVENTOR(S) : Lin et al.

It is certified that error appears in the above-identified patent and that said Letters Patent is hereby corrected as shown below:

In the Claims

Column 10, Lines 16-18:
"patterning the conductive layer using the patterned dielectric layer as a mask to forma patterned conductive layer" should read -- patterning the conductive layer using the patterned dielectric layer as a mask to form a patterned conductive layer --.

Signed and Sealed this
Twenty-fourth Day of March, 2020

Andrei Iancu
*Director of the United States Patent and Trademark Office*